(12) United States Patent
Zhang

(10) Patent No.: US 10,937,859 B2
(45) Date of Patent: Mar. 2, 2021

(54) METHOD FOR MANUFACTURING POWER DEVICE

(71) Applicant: HANGZHOU SILAN MICROELECTRONICS CO., LTD., Hangzhou (CN)

(72) Inventor: Shaohua Zhang, Hangzhou (CN)

(73) Assignee: HANGZHOU SILAN MICROELECTRONICS CO., LTD., Hangzhou (CN)

( * ) Notice: Subject to any disclaimer, the term of this patent is extended or adjusted under 35 U.S.C. 154(b) by 148 days.

(21) Appl. No.: 16/306,333

(22) PCT Filed: Oct. 20, 2017

(86) PCT No.: PCT/CN2017/107010
§ 371 (c)(1),
(2) Date: Nov. 30, 2018

(87) PCT Pub. No.: WO2018/082455
PCT Pub. Date: May 11, 2018

(65) Prior Publication Data
US 2019/0172905 A1  Jun. 6, 2019

(30) Foreign Application Priority Data
Nov. 1, 2016  (CN) .......................... 2016 1 0941707

(51) Int. Cl.
*H01L 29/66* (2006.01)
*H01L 29/06* (2006.01)
(Continued)

(52) U.S. Cl.
CPC ...... *H01L 29/0634* (2013.01); *H01L 29/0619* (2013.01); *H01L 29/66128* (2013.01);
(Continued)

(58) Field of Classification Search
None
See application file for complete search history.

(56) References Cited

U.S. PATENT DOCUMENTS

| 4,754,310 A | 6/1988 | Coe |
| 5,216,275 A | 6/1993 | Chen |

(Continued)

FOREIGN PATENT DOCUMENTS

| CN | 102800701 A | 11/2012 |
| CN | 103066125 A | 4/2013 |

(Continued)

OTHER PUBLICATIONS

International Search Report and Written Opinion for International Application No. PCT/CN2017/107010, dated Jan. 29, 2018, 7 pages.

(Continued)

*Primary Examiner* — Ali Naraghi
(74) *Attorney, Agent, or Firm* — Westman, Champlin & Koehler, P.A.

(57) ABSTRACT

A method for manufacturing a power device is disclosed. The method for manufacturing the power device comprises: forming a first doped region on the semiconductor substrate; forming a plurality of second doped regions in a first region of the first doped region; and forming a plurality of third doped regions in a second region of the first doped region. A first charge compensation structure is formed by the first doped region and the plurality of second doped regions, the first charge compensation structure and the semiconductor substrate are located on current channel. A second charge compensation structure is formed by the first doped region and the plurality of third doped regions, the second charge compensation structure is configured to disperse continuous surface electric field of the power device. The power device manufactured by the method not only has a stable blocking (Continued)

voltage and an improved reliability, but also has a reduced on-resistance.

11 Claims, 8 Drawing Sheets

(51) Int. Cl.
  *H01L 29/78* (2006.01)
  *H01L 29/861* (2006.01)
  *H01L 29/739* (2006.01)
(52) U.S. Cl.
  CPC .. *H01L 29/66136* (2013.01); *H01L 29/66666* (2013.01); *H01L 29/7397* (2013.01); *H01L 29/7828* (2013.01); *H01L 29/861* (2013.01); *H01L 29/8611* (2013.01); *H01L 29/66333* (2013.01); *H01L 29/7395* (2013.01)

(56) References Cited

U.S. PATENT DOCUMENTS

| | | | |
|---|---|---|---|
| 9,123,561 B2* | 9/2015 | Tamura | H01L 29/0878 |
| 9,391,137 B2 | 7/2016 | Kim | |
| 2008/0135930 A1* | 6/2008 | Saito | H01L 29/7811 257/330 |
| 2009/0101974 A1* | 4/2009 | Saito | H01L 29/7811 257/342 |
| 2012/0098064 A1* | 4/2012 | Onishi | H01L 29/404 257/341 |
| 2012/0299094 A1 | 11/2012 | Lee et al. | |
| 2017/0179225 A1 | 6/2017 | Lee et al. | |

FOREIGN PATENT DOCUMENTS

| | | |
|---|---|---|
| CN | 105097932 A | 11/2015 |
| CN | 106571394 A | 4/2017 |
| CN | 206422069 U | 8/2017 |

OTHER PUBLICATIONS

First Office Action, including Search Report, for Chinese Patent Application No. 201610941707.1, dated Oct. 17, 2017, 7 pages.
Extended European search report for European Patent Application No. 17866656.6 dated Mar. 23, 2020, 10 pages.

* cited by examiner

METHOD FOR MANUFACTURING POWER DEVICE

CROSS-REFERENCE TO RELATED APPLICATION

This application is a Section 371 National Stage application of International Application No. PCT/CN2017/107010, filed on 20 Oct. 2017, which published as WO 2018/082455 A1, on 11 May 2018, which claims priority to Chinese Patent Application No. 201610941707.1, filed on Nov. 1, 2016, entitled "power device and method for manufacturing the same", the contents of which are incorporated herein by reference in their entireties.

BACKGROUND OF THE DISCLOSURE

Field of the Disclosure

The present invention relates to a power device, and particularly to a power device comprising charge compensation structures.

Description of the Related Art

Power devices are mainly used in power supply circuits and control circuits with high power, for example, as switching elements or rectifying elements. In the power device, doped regions of different doping type form a PN junction, so that functions of diodes or transistors can be performed. The power device is typically required to carry a large current in some applications under high voltage. On one hand, the breakdown voltage of the power device is required to be high enough, in order to meet requirements in high-voltage applications and to improve device reliability and lifetime. On the other hand, the power device is required to have a low on-resistance in order to reduce power consumption of the power device itself and generate less heat.

U.S. Pat. Nos. 5,216,275 and 4,754,310 disclose a power device of charge-compensation type, wherein a plurality of P type doped regions and a plurality of N type doped regions are alternately arranged in horizontal direction or stacked in vertical direction. When the power device is operating under conductive state, one of the N type doped regions or one of the P type doped regions provides a low resistance conductive path. When the power device is operating under off state, charges in a P type doped region can be depleted with charges in an N type doped region adjacent to the P type doped region. Thus, the power device of charge-compensation type can significantly reduce the on-resistance, thereby reduce the power consumption.

Another improved power device includes a loop region and a cell region surrounded by the loop region. P type doped regions and N type doped regions are formed in the cell region of the power device, additional P type doped regions and additional N type doped regions are formed in the loop region. The loop region is essential for achieving high-voltage and reliability characteristics. When the device is turned off, the loop region functions to relieve a surface electric field existing at the edge of the power device, especially under high temperature and high voltage conditions, to reduce electric field impact on a surface oxide layer of the power device, and to reduce leakage current of the power device under high temperature condition. Generally, it is desirable that the loop region has a larger blocking voltage than that of the cell region, whereby most of the current is able to flow out from the cell region when the power device is broken down. Compare with the area of the loop region, the area of the cell region is much larger, which helps to improve the avalanche capability of the power device.

It is desired to provide a power device comprising both of the two above-mentioned structures, in order to reduce the on-resistance and improve the voltage withstanding characteristic simultaneously. However, in practical applications, reducing the on-resistance and improving the voltage withstanding characteristic are contradictory. Although by increasing impurity concentration of the N type doped regions, current capability of the current path can be improved and small on-resistance can be achieved, however, increasing impurity concentration of the N type doped regions requires a high matching degree of compensation, and it is difficult to make the impurity concentration of the N type doped regions exactly the same with that of the P type doped regions. If there is a slightly deviation between the impurity concentrations of the N type doped regions and the P type doped regions, the blocking voltage will be greatly reduced, such that the blocking voltage is unstable. Especially, in the loop region, it is even more difficult to improve the blocking voltage and the reliability.

In the power device including the charge compensation structure and the loop region, it is still necessary to further improve the loop region structure, in order to meet the requirements on both of on-resistance and breakdown voltage.

SUMMARY OF THE DISCLOSURE

In view of the above problems, an object of the present invention is to provide a power device and a method for manufacturing the same, wherein, an additional charge compensation structure is comprised in a loop region of the power device, in order to meet the requirements on both of on-resistance and breakdown voltage.

According to an aspect of the present invention, there is provided a power device comprising: a semiconductor substrate; a first doped region on the semiconductor substrate; a plurality of second doped regions located in a first region of the first doped region; and a plurality of third doped regions located in a second region of the first doped region, wherein the semiconductor substrate and the first doped region are first doping type, the plurality of second doped regions and the plurality of third doped regions are second doping type, the second doping type is opposite to the first doping type, the plurality of second doped regions are separated from each other at a first predetermined spacing, a first charge compensation structure is formed by the plurality of second doped regions and the first doped region, the first charge compensation structure and the semiconductor substrate are located on a current channel, the plurality of third doped regions are separated with each other at a second predetermined spacing, a second charge compensation structure is formed by the plurality of third doped regions and the first doped region, the second charge compensation structure is configured to disperse continuous surface electric field of the power device.

Preferably, the first charge compensation structure is located in a cell region of the power device, the second charge compensation structure is located in a loop region of the power device, the cell region is surrounded by the loop region.

Preferably, the plurality of second doped regions and the plurality of third doped regions are configured to extend in the first doped region longitudinally towards the semiconductor substrate, with a non-linear decrease of doping concentration.

Preferably, average doping concentrations of the plurality of second doped regions and the plurality of third doped regions are respectively lower than an average doping concentration of the first doped region.

Preferably, an average doping concentration of the plurality of second doped regions is greater than that of the plurality of third doped regions, so that an on-resistance of the cell region is reduced and a breakdown voltage of the cell region is improved by use of a difference between the average doping concentrations.

Preferably, the average doping concentration of the plurality of second doped regions is 10% or over 10% higher than that of the plurality of third doped regions.

Preferably, the plurality of second doped regions each comprise a first sub-region and a second sub-region, an average doping concentration of the first sub-region is less than that of the first doped region, an average doping concentration of the second sub-region is equal to that of the first doped region.

Preferably, the average doping concentration of the first sub-region is 20% or over 20% less than that of the first doped region.

Preferably, the plurality of second doped regions each have a first transverse dimension, the plurality of third doped regions each have a second transverse dimension, and the first transverse dimension is greater than the second transverse dimension.

Preferably, a ratio of the first transverse dimension to the first predetermined spacing is equal to a ratio of the second transverse dimension to the second predetermined spacing.

Preferably, a sum of the first transverse dimension and the first predetermined spacing is integral multiples of a sum of the second transverse dimension and the second predetermined spacing.

Preferably, the plurality of second doped regions are formed by ion implantation with a first ion implantation dosage, the plurality of third doped regions are formed by ion implantation with a second ion implantation dosage, the first ion implantation dosage and second ion implantation dosage range from $2E12$ $cm^{-2}$ to $2E13$ $cm^{-2}$.

Preferably, the first ion implantation dosage and the second ion implantation dosage are the same.

Preferably, the first ion implantation dosage is 20% or over 20% higher than the second ion implantation dosage.

Preferably, the plurality of second doped regions and the plurality of third doped regions are respectively formed in deep trenches, the deep trenches are configured to extend in the first doped region longitudinally towards the semiconductor substrate, with a decrease of transverse dimension.

Preferably, the deep trench is formed by etching, and has a shape with a reduction of transverse dimension by etching with different angles.

Preferably, a lower portion of each deep trench is obtained by etching with an angle ranging from 85° to 87°, an upper portion of each deep trench is obtained by etching with an angle ranging from 88° to 89°.

Preferably, the cell region further comprises: a plurality of fourth doped regions located on the plurality of second doped regions; and a plurality of fifth doped regions, which are respectively located in the plurality of fourth doped regions.

Preferably, the cell region further comprises: a plurality of sixth doped regions, respectively located in the plurality of fourth doped regions, and serving as leading-out ends of the plurality of fourth doped regions.

Preferably, the cell region further comprises a plurality of gate stacked layers, each comprising a gate dielectric or a gate conductor, at least a portion of each gate stacked layer is located between the plurality of fifth doped regions and the first doped region, wherein the plurality of fourth and fifth doped regions are second doping type and first doping type, respectively, the power device is a MOSFET, the semiconductor substrate, the plurality of fourth doped regions, and the plurality of fifth doped regions serve as a drain region, a well region and a source region of the MOSFET, respectively, the plurality of fourth doped regions are located between the plurality of fifth doped regions and the first doped region and are configured to form a channel.

Preferably, the plurality of fourth and fifth doped regions are second doping type, wherein, the power device is a diode, the plurality of fourth doped regions, the semiconductor substrate serve as an anode and a cathode of the diode, respectively.

Preferably, the loop region further comprises: a seventh doped region, which is the second doping type and located in the first doped region; and an eighth doped region, which is the second doping type, located in the first doped region and separated with the plurality of third doped regions and the seventh doped region, wherein the seventh doped region is configured to extend in the cell region laterally towards at least one of the plurality of fourth doped regions to form a main junction, and extend longitudinally from a surface of the first doped region to a predetermined depth, the seventh doped region is configured to contact with at least some of the plurality of third doped regions, so that said at least some of the plurality of third doped regions are configured to connect with at least some of the plurality of second doped regions through the main junction, the eighth doped region is configured to limit boundaries of the power device and to serve as a cut-off loop.

Preferably, the power device further comprises: an interlayer dielectric layer; a first electrode through the interlayer dielectric layer, configured to be electrically connected to the plurality of fifth doped regions; a second electrode through the interlayer dielectric layer, configured to be electrically connected to the eighth doped region; and a third electrode, configured to be electrically connected to the semiconductor substrate.

Preferably, the first doping type is one of P type and N type, the second doping type is the other one of N type and P type.

Preferably, the power device is selected from one of a metal oxide semiconductor field effect transistor, an insulated gate bipolar transistor and a diode.

According to another aspect of the present invention, there is provided a method for manufacturing a power device, comprising: forming a first doped region on the semiconductor substrate; forming a plurality of second doped regions in a first region of the first doped region; and forming a plurality of third doped regions in a second region of the first doped region, wherein the semiconductor substrate and the first doped region are first doping type, the plurality of second and third doped regions are second doping type, the second doping type is opposite to the first doping type, the plurality of second doped regions are separated with each other at a first predetermined spacing, a first charge compensation structure is formed by the first doped region and the plurality of second doped regions, the first charge compensation structure and the semiconductor substrate are located on current channel, the plurality of third doped regions are separated with each other at a second predetermined spacing, a second charge compensation structure is formed by the first doped region and the plurality of third doped regions, the second charge compensation structure is configured to disperse continuous surface electric field of the power device.

Preferably, an average doping concentration of the plurality of second doped regions is greater than that of the plurality of third doped regions, so that an on-resistance of the cell region is reduced and a breakdown voltage of the cell region is improved by use of a difference between the average doping concentrations.

Preferably, step of forming the plurality of second doped regions in the first region of the first doped region comprises performing a first ion implantation through a first mask, step of forming the plurality of third doped regions in the second region of the first doped region comprises performing a second ion implantation through a second mask.

Preferably, openings of the first mask each have a first transverse dimension, openings of the second mask each have a second transverse dimension, and the first transverse dimension is greater than the second transverse dimension.

Preferably, a first ion implantation dosage is used during the first ion implantation, a second ion implantation dosage is used during the second ion implantation, the first ion implantation dosage and the second ion implantation dosage range from 2E12 cm$^{-2}$ to 2E13 cm$^{-2}$.

Preferably, the first ion implantation dosage and the second ion implantation dosage are the same.

Preferably, the first ion implantation dosage is 20% or over 20% higher than the second ion implantation dosage.

Preferably, step of forming the plurality of second doped regions in the first region of the first doped region comprises filling first deep trenches with a plurality of epitaxial layers, step of forming the plurality of third doped regions in the second region of the first doped region comprises filling second deep trenches with a plurality of second epitaxial layers.

Preferably, the first and second deep trenches extend in the first doped region longitudinally towards the semiconductor substrate, with a decrease of transverse dimension.

Preferably, the deep trenches are formed by etching, and each have a shape with a reduction of transverse dimension by etching with different angles.

Preferably, a lower portion of each deep trench is obtained by etching with an angle ranging from 85° to 87°, an upper portion of each deep trench is obtained by etching with an angle ranging from 88° to 89°.

According to the power device and the method for manufacturing the same in the embodiments of the present invention, the first charge compensation structure and the second charge compensation structure are formed in the cell region and the loop region of the power device, respectively. Since the first and the second charge compensation structures can be formed by a same process simultaneously, the power device disclosed in the embodiments does not increase cost and complexity of the process. In the cell region, the first charge compensation structure comprises a P type doped region and an N type doped region adjacent to each other, charges depletion occurs between the P type and N type doped regions, so that the on-resistance and the power consumption of the power device can be significantly reduced. In the loop region, because of the second charge compensation structure, a depletion layer located at edge of the cell region can be extended, which helps to alleviate the reversed electric field generated at the edge of the cell region, thus the breakdown voltage of the power device can be improved.

In a preferred embodiment, there is a difference on the average doping concentration of the P type doped regions between the first charge compensation structure and the second charge compensation structure, which can reduce the on-resistance of the cell region and improve the breakdown voltage of the cell region simultaneously.

In a preferred embodiment, the first and the second charge compensation structures can be formed by different ion implantation processes, in order to make a difference on the doping concentration of the P type regions between the first and the second compensation structures. Alternatively, one ion implantation process using windows with different dimensions can also make a difference on doping concentration of the P type doped regions between the first and the second charge compensation structures. Alternatively, the trenches can be etched with different angles and then filled with the epitaxial layers, in order to make a difference on doping concentration of the P type doped regions between the first charge compensation structure and the second charge compensation structure.

Compared with the prior art, the present invention does not increase complexity and cost of the process, and based on that, the present invention can meet both of the requirements on the breakdown voltage and the on-resistance of the power device, by adjusting the doping concentration of the P type regions in the first and the second charge compensation structures.

BRIEF DESCRIPTION OF THE DRAWINGS

By following description of embodiments with reference to the accompanying drawings of the present invention, the above and other objects, features and advantages of the present invention will become apparent.

DETAILED DESCRIPTION OF THE DISCLOSURE

Various embodiments of the present invention will be described in more detail with reference to figures of the embodiments. In the figures, the same elements are referenced by same or similar identical reference markings. For clarity, elements in the figures are not drawn to scale.

The present invention may be presented in various forms, some examples of which will be described hereinafter.

First Embodiment

Figure 1:
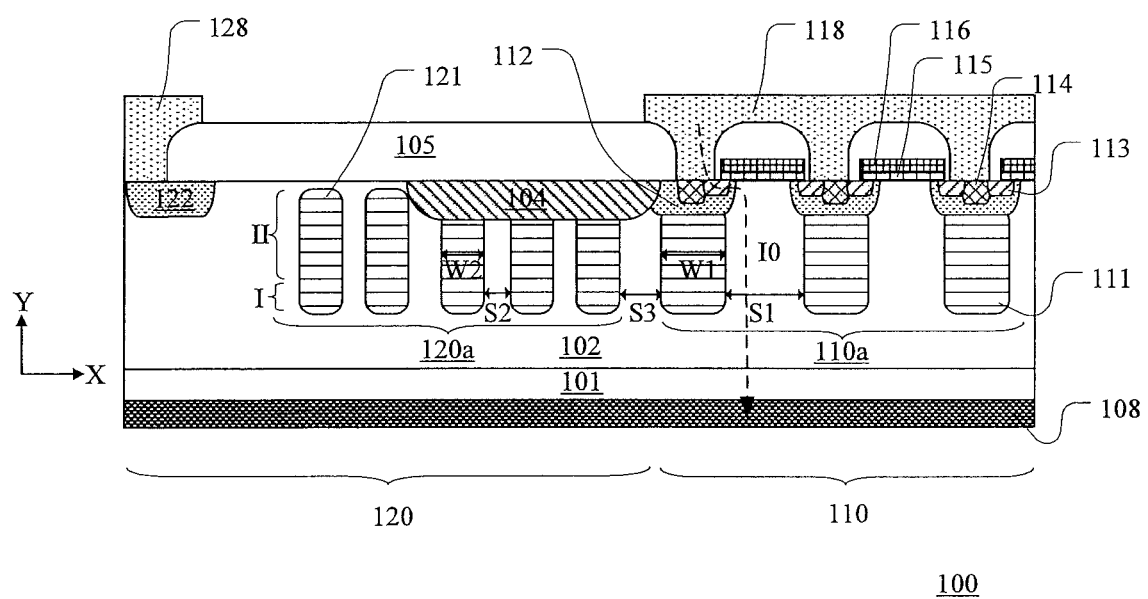
FIGS. 1 and 2 respectively show a cross-sectional view and a top view of a power device according to a first embodiment of the present invention.
Figure 2:
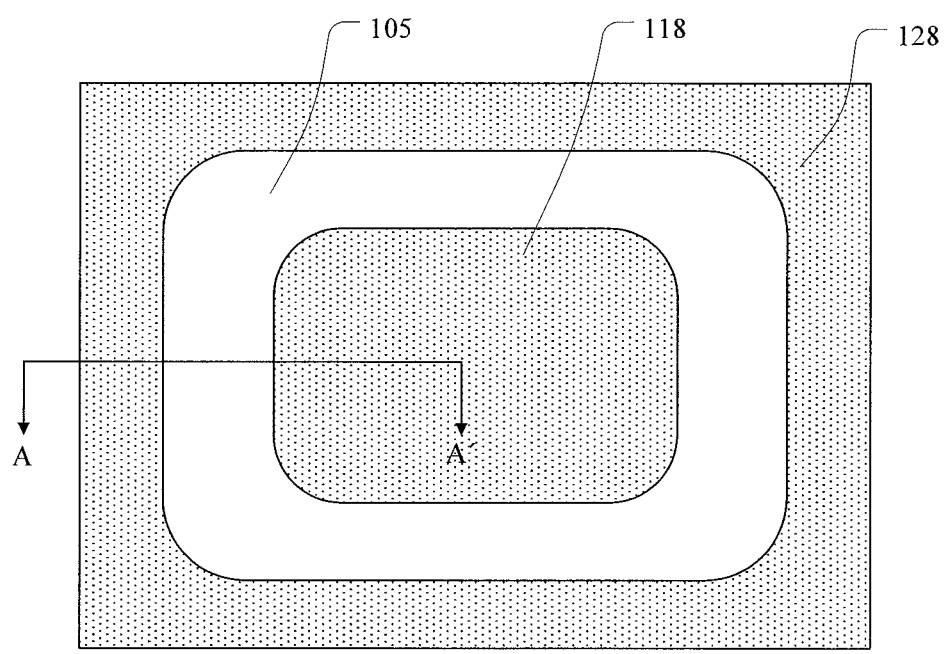

FIGS. 1 and 2 respectively show a cross-sectional view and a top view of a power device according to a first embodiment of the present invention, wherein FIG. 1 is a cross-sectional view taken along line AA' of the top view shown in FIG. 2. In this embodiment, the power device 100 is a metal oxide semiconductor field effect transistor (MOSFET). Hereinafter, an N type MOSFET is taken as an example, however, the present invention is not limited thereto.

In FIG. 1, only a portion structure of a loop region 120 is shown. As shown in FIG. 1, the power device 100 comprises a loop region 120 and a cell region 110 surrounded by the loop region 120. The loop region 120 has a closed shape surrounding the cell region 110. Each of the cell region 110 and the loop region 120 comprises a plurality of first doped regions 102 and a plurality of P type doped regions. A source region, a drain region, a channel and a compensation region are provided by the first doped regions 102 and the P type doped regions in the cell region 110, thus forming a current path when the power device is turned on. The first doped regions 102 and third doped regions 121 in the loop region 120 are configured to disperse surface electric field at the edge of the power device.

Further, referring to FIG. 1, longitudinal structures of the cell region 110 and the loop region 120 are shown. For simplicity and clarity, the figures only show the longitudinal structures of the cell region 110 comprising two cells and the loop region 110 comprising 5 third doped regions 121, while in actual products, the cell region may comprise more than two cells and the loop region may have more or less than five third doped regions. In the power device 100, the cell region 110 and the loop region 120 comprise a common semiconductor substrate 101 and the first doped regions 102 located on the semiconductor substrate 101. In this embodiment, the semiconductor substrate 101, for example, is a silicon substrate of N++ type, each first doped region 102, for example, is an in-situ doped epitaxial semiconductor layer of N type. The semiconductor substrate 101 is used as the drain region of the MOSFET.

In the cell region 110, a plurality of second doped regions 111 of P type are formed in the first doped region 102. The doping type of the first doped region 102 is opposite to the doping type of the plurality of second doped regions 111, the plurality of second doped regions 111 are alternately arranged in the first doped region 102, forming a first charge compensation structure 110a. In the loop region 120, the plurality of third doped regions 121 of P type doping are formed in the first doped type 102. The doping type of the first doped region 102 is opposite to the doping type of the plurality of third doped regions 121, the plurality of third doped regions 121 are alternately arranged in the first doped region 102, forming a second charge compensation structure 120a. The plurality of second doped regions 111 and the plurality of third doped regions 121 have a decreased doping concentration distribution from top to bottom, respectively, and each of the doped regions may comprise a plurality of stacked epitaxial layers.

Further, in the cell region 110, a plurality of fourth doped regions 112 are formed above the plurality of second doped regions 111, and a plurality of fifth doped regions 113 are formed in the fourth doped regions 112. The fourth doped regions 112 and the fifth doped regions 113, for example, are formed by ion implantation and doped with P type dopant and N+ type dopant, respectively. The fourth doped regions 112 serve as a body well region of the MOSFET, the fifth doped regions 113 serve as the source region of MOSFET. Bottom of each fourth doped region 112 contacts with a corresponding one of the second doped regions 111. Preferably, a plurality of sixth doped regions 114 can also be formed in the fourth doped regions 112. The sixth doped regions 114, for example, are formed by ion implantation and doped with P+ type dopant. The sixth doped regions 114 extend into the fourth doped regions 112 and adjoin to the fifth doped regions 113. In the preferred embodiment, the sixth doped regions 114 serve as the leading-out ends of the body well region.

On surfaces of the first doped regions 102 and the fourth doped regions 112, gate stacked layers are formed and each comprise a gate dielectric 115 or a gate conductor 116. At least a portion of the gate conductor 116 extends laterally from above the corresponding first doped region 102 to above the fifth doped regions 113. The channel of MOSFET is formed by a portion of the fourth doped regions 112 located below the gate conductors 116 and the portion of the forth doped regions 112 is located between the first doped regions 102 and the fifth doped regions 113.

Further, in the loop region 120, a seventh doped region 104 is formed in the first doped region 102. The seventh doped region 104, for example, is formed by ion implantation and doped with P type dopant. The seventh doped region 104 extends laterally to the fourth doped region 112, thus a main junction is formed. The seventh doped region 104 extends longitudinally from the surface to a predetermined depth, contacts with a part of the third doped regions 121, such that a part of the fourth doped regions 112 can connect with a part of the third doped regions 112 through the main junction. Further, an eighth doped region 122 is formed in the first doped region 102. The boundary of MOSFET is limited by the eighth doped region 122, which serves as a cut-off ring. The eighth doped region 122, for example, is formed by ion implantation and doped with P+ type dopant. The eighth doped region 122 and the fourth doped regions 112, both of which are doped with a same type dopant and extend to a same depth, may be formed at the same time.

Further, an interlayer dielectric layer 105 is configured to cover the above device structure. A through hole is formed in the interlayer dielectric layer 105. A first electrode 118 is configured to contact with the fifth doped regions 113 via the through hole, thus providing an electrical connection to the source region. Meanwhile, the first electrode 118 is configured to provide short connections between the fifth doped regions 113 and the sixth doped regions 114. A second electrode 128 is configured to contact with the eighth doped region 122 via the through hole, thus providing an electrical connection to the cut-off ring. A third electrode 108 is formed on a surface of semiconductor substrate 101 which is opposite to the first doped regions 102, thus providing an electrical connection to the drain region. In this embodiment, the first electrode 118 and the third electrode 108 serve as a source electrode and a drain electrode of the MOSFET, respectively.

For clearly illustration, a horizontal direction X and a vertical direction Y are defined in FIG. 1. The horizontal direction X extends laterally from the loop region 120 to the cell region 110. The vertical direction Y extends longitudinally from the semiconductor substrate 101 to the fifth doped regions 113.

In the horizontal direction X, W1 represents a width of one second doped region 111, S1 represents a spacing between the adjacent second doped regions 111; W2 represents the width of one third doped region 121, S2 represents a spacing between the adjacent third doped regions 121, S3 represents a spacing between one third doped region 121 and one second doped region 111 adjacent to each other. In actual manufacturing process, a requirement on implantation window in X direction should be satisfied by the following rule: W1+S1=n*(W2+S2), and W1/(W1+S1)=W2/(W2+S2), where n is an integer.

In the vertical direction Y, the doping concentration of the second doped regions 111 and the third doped regions 121 are non-linearly changed. Tops of each second doped region 111 and each third doped region 121 are close to the source region of the power device, i.e., the fifth doped regions 113, bottoms of each second doped region 111 and each third doped region 121 are close to the drain region of the power device, i.e., the semiconductor substrate 101. The second doped regions 111 and the third doped regions 121 have a decreased doping concentration distribution from top to bottom, respectively.

When the power device 100 is operating, a gate voltage is applied to the gate conductor 116. When the gate voltage is lower than a threshold voltage, the power device is turned off, and a high voltage is applied to the drain electrode. With an increase of the drain voltage, the charge compensation structures may form a depletion layer to carry voltage. The first charge compensation structure can withstand a relatively high voltage, due to the compensation between the second doped regions 111 and the first doped region 102. Although dimension scales of each second doped regions 111 and each third doped regions 121 are the same, impurity diffusion situations in each second doped region 111 and each third doped region 121 are different in the subsequent high-temperature manufacturing process as the dimension of each second doped region 111 is larger than that of each third doped region 121 in the second charge compensation structure, such that under a same voltage applied to the drain electrode, the impurity in the third doped region 121 is more likely to be compensated and depleted by the impurity in the first doped region 102, that is, the absolute value of the second charge compensation structure has an even smaller compensation matching degree. In general, a 600V high-voltage power device with the loop region 110 according to the embodiment of the present disclosure may have around 60V higher blocking voltage than the blocking voltage of the cell region 110, thus fully meeting the reliability requirement of the power device.

Although the above improvement can be used in the second charge compensation structure for easily reaching a high blocking voltage, this processing method may also reduce the size of the first doped region 102 at the same time. That is, if the same processing method is used in the cell region 110, the current path may become narrow, the on-resistance may be significantly increased, both of which are not desirable. To further reduce the on-resistance under the premise of ensuring the high blocking voltage of the cell region 110 in the first charge compensation structure, each second doped region 111 is divided into region I and region II, wherein the region I is close to the drain electrode, the region II is close to the source electrode. In the region I, the doping concentration of the second doping regions 111 is lower than that of the first doped region 102; in the region II, the doping concentration of the second doped region 111 is the same with that of the first doped region 102.

Specifically, each second doped region 111 is divided into different sub-regions in the vertical direction Y, the compensation matching degree of the sub-regions changes from −20% to 0%, starting from the area near the drain electrode; in the area near the source electrode, the compensation matching degree of the sub-regions remains unchanged at 0%. A charge matching concentration is 0%, i.e., the doping concentrations of each second doped region 111 and the first doped region 102 are the same, while the doping concentration of the sub-region near the drain electrode are set to be mismatched with the doping concentration of the first doped region.

During the operation period of the power device, when the gate voltage of the power device is higher than the threshold voltage, the power device is turned on, current flows from the drain electrode to the source electrode, through the first doped region 102. When the gate voltage is lower than the threshold voltage, the power device is turned off, and a high voltage is applied to the drain electrode. The loop region 120 is used to alleviate the reverse electric field formed between the cell region 110 and the first doped region 102 at the edge of the power device, thus carrying the drain voltage.

In a semiconductor device, the breakdown voltage of an ideal planar PN junction is determined only by the concentration and thickness of the epitaxial layer. However, a junction-end effect will occur in the edge area of an actual device, that is, the profile of the depletion layer of the PN junction between the cell region 110 and the first doped region 102 near the edge of the power device is curved, that is, a curvature effect of the PN junction exists. When a reverse voltage is applied, the strongest electric field appears at a position with a maximum curvature in the PN junction, such that the PN junction may be broken down prematurely or have a larger reverse leakage current, reducing the blocking voltage and the reliability.

The power device according to this embodiment of the present invention, the cell region 110 is surrounded by the loop region 120, the second charge compensation structure 120a is formed in the loop region 120. Because of the design of doping concentration distribution of the third doped regions 121 in the second charge compensation structure 120a, when the reverse voltage is applied, the third doped regions 121 is depleted with the first doped regions 102 much fully, which forms a depletion layer connected to the depletion layer at the edge of the cell region and extending the depletion layer at the edge of the cell region effectively, such that end-curvature is reduced and the blocking voltage is improved. Meanwhile, the movable carriers in the depletion layer in the loop region 120 are greatly reduced, a high-resistance region is formed, such that the reverse leakage current is reduced effectively and the reliability is improved.

Figure 3:
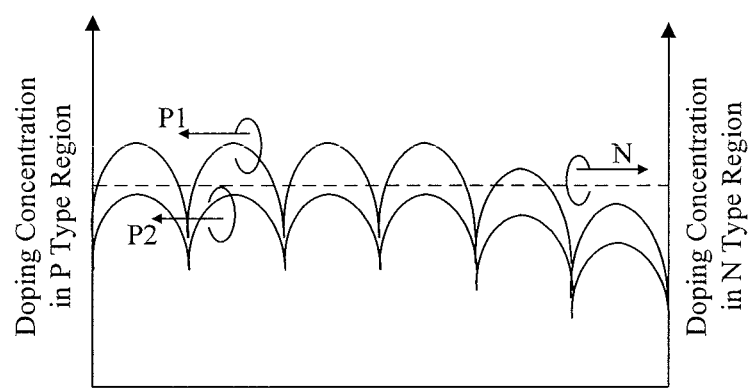
FIG. 3 shows the doping concentration distribution of each doped region in the power device in accordance with the first embodiment of the present invention.

FIG. 3 shows the doping concentration distribution of each doped region in the power device in accordance with the first embodiment of the present invention. A curve P1 shows the doping concentration distribution of each second doped region 111 from its top end to bottom end, a curve P2 shows the doping concentration distribution of each third doped region 121 from its top end to bottom end, and a curve N shows the doping concentration distribution of the first doped region 102 from its top end to bottom end. Compared with the power device in the prior art, in the power device according to the embodiment of the present invention, the doping concentrations of each second doped region 111 and each third doped region 121 change non-linearly, decreasing from top end to bottom end. The average doping concentration of the second doped regions 121 and the average doping concentration of the third doped regions 111 are lower than the average doping concentration of the first doped region 102. Further, the average doping concentration of the third doped regions 121 is lower than the average doping concentration of the second doped regions 111.

Figure 4:
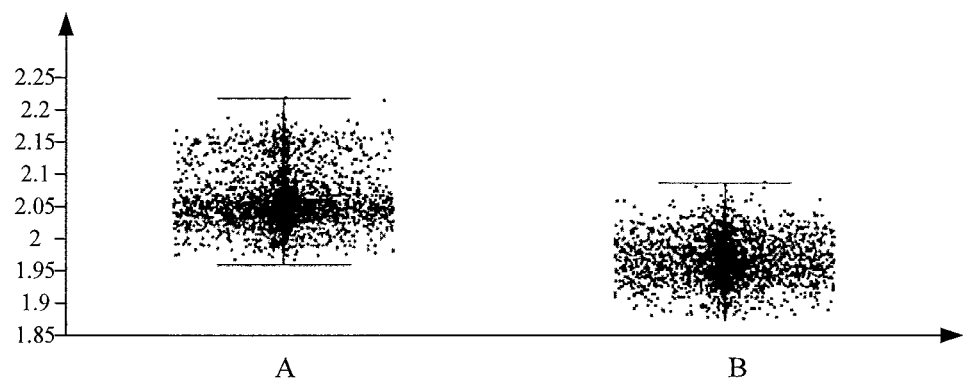
FIGS. 4 and 5 respectively show a distribution diagram of the on-resistance and a distribution diagram of the breakdown voltage of the power device according to the first embodiment of the present invention.
Figure 5:
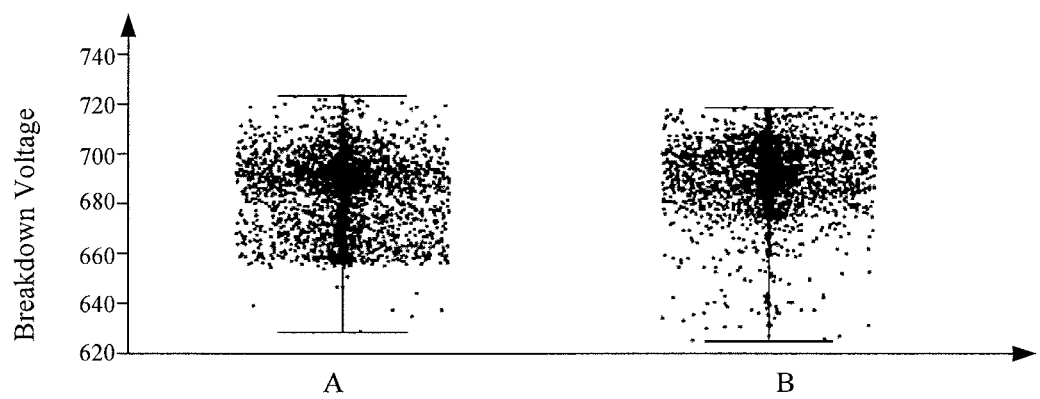

FIGS. 4 and 5 respectively show a distribution diagram of the on-resistance and a distribution diagram of the breakdown voltage of the power device according to the first embodiment of the present invention.

FIG. 4 shows a comparison diagram of the on-resistance distributions of 600V power devices which are operated under turned-on state according to the prior art and the present embodiment, respectively, wherein symbol A represents the power device in the prior art, and symbol B represents the power device according to the embodiment of the present invention. The on-resistance of the power device according to the present embodiment is lower than that of the prior art, because the doping concentration of the part of the second doped regions 111 near the source electrode is reduced, which reduces the junction resistance.

When the power device is turned off, although the doping concentration of the first charge compensation structure cannot be completely matched, charge compensation can also be performed to generate the depletion layer when there is a voltage applied to the drain electrode, so that a high blocking voltage is achieved. FIG. 5 shows a comparison diagram of the breakdown voltage distributions of 600V power devices according to the prior art and the present embodiment, respectively, wherein symbol A represents the power device in the prior art, and symbol B represents the power device according to the embodiment of the present invention. It can be seen from the figure that the breakdown voltage of the power device according to the present embodiment distributes wider than the breakdown voltage of the power device according to the prior art, mainly due to a slight difference of the charge compensation matching degree of the first charge compensation structure. Even if the blocking voltage of the power device is relatively low, the blocking voltage of the loop region 110 is still higher than that of the cell region 100 due to the small absolute value of the compensation matching degree of the second charge compensation structure in the loop region 110, such that the reliability of the power device is ensured.

Second Embodiment

FIGS. 6a to 6h show cross-sectional views illustrating different steps of a method for manufacturing a power device according to a second embodiment of the present invention.

Figure 6A:
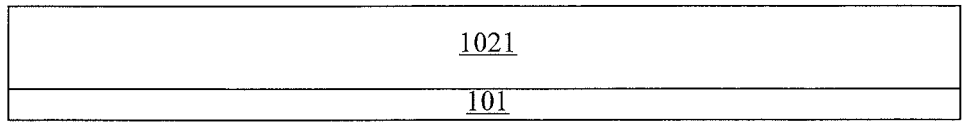
FIGS. 6a to 6h show cross-sectional views illustrating different steps of a method for manufacturing a power device according to a second embodiment of the present invention.

A first epitaxial layer 1021 is grown on the semiconductor substrate 101, shown in FIG. 6a.

In this embodiment, the semiconductor substrate 101, for example, is a silicon substrate of N++ type doping. For example, the semiconductor substrate 101 is a single crystal silicon substrate with <100> crystal orientation, a resistivity ranging from 0.01 to 0.03 ohms*cm, and a thickness of around 600 um. The first epitaxial layer 1021, for example, is formed by a reduced pressure epitaxy process under a temperature condition of 1050~1150° C. and is an in-situ doped epitaxial semiconductor layer of N type doping. The semiconductor substrate 101 may serve as the drain region of MOSFET.

The thickness and resistivity of the first epitaxial layer 1021 vary greatly in the power devices with various blocking voltages. The thickness of the first epitaxial layer 1021, for example, ranges from 14 um to 24 um, and the resistivity of the first epitaxial layer 1021, for example, ranges from 0.8 to 3 ohms*cm. Further, as required, in order to increase the concentration of the first epitaxial layer 1021, N type dopants are implanted to the integral surface of the first epitaxial layer 1021, the implantation typically use phosphorus dopant, and the implantation dosage is generally selected from 7E11 $cm^{-2}$ to 7E12 $cm^{-2}$.

Figure 6B:
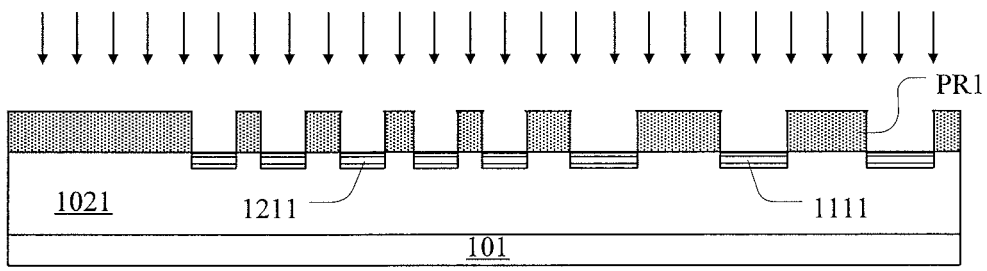

Then, the surface of the first epitaxial layer 1021 is coated by photoresist, and a photoresist mask PR1 is formed by photolithography processes including exposure, development, etc. The photoresist mask PR1 comprises pattern of injection windows which are configured to expose the surface of the first epitaxial layer 1021 at corresponding positions to the second doped regions and the third doped regions. The impurity implantation is performed through the photoresist mask PR1, as shown in FIG. 6b.

In order to form the second doped regions and the third doped regions of P type, an ion implantation using boron dopant is performed, the implantation energy is generally selected from 60 Kev to 180 Kev, the dosage is generally selected from 2E12 $cm^{-2}$ to 2E13 $cm^{-2}$. After the ion implantation, the photoresist mask PR1 is removed by ashing or dissolved by solvent.

As described above, the implantation window is required to satisfy the following rules: W1+S1=n*(W2+S2), and W1/(W1+S1)=W2/(W2+S2), wherein W1 represents a width of one second doped region, S1 represents a spacing between the adjacent second doped regions; W2 represents the width of one third doped region, S2 represents a spacing between the adjacent third doped regions, S3 represents a spacing between one third doped region and one second doped region adjacent to each other, and n is an integer.

The ion implantation forms the doped regions 1111 through the implantation windows corresponding to the second doped regions, and forms the doped regions 1211 through the implantation windows corresponding to the third doped regions. The doped regions 1111 and 1211 extend downward to a predetermined depth. Since the sizes of the implantation windows are different, even if the implantation conditions are the same, the doping concentration of the doped region 1211 may be 10% lower than that of the doped regions 1111.

Then, the steps shown in FIGS. 6a and 6b are repeated for forming a second epitaxial layer 1022 on the first epitaxial layer 1021 and forming the doped regions 1112 and 1212 in the second epitaxial layer 1022. The thickness of the second epitaxial layer 1022 typically ranges from 5 um to 8 um, and the resistivity of the second epitaxial layer 1022 is typically ranges from 0.8 ohms*cm to 3 ohms*cm. The doped regions 1112 and 1212 extend downward to a predetermined depth from the second epitaxial layer 1022. In the process of the ion implantation, the implantation windows of the doped regions 1112 are configured to align with the doped regions 1111 which are previously formed and have a same dopant implantation dosage with the dope regions 1111, the implantation windows of the doped regions 1212 are configured to align with the doped regions 1211 which are previously formed and have a same dopant implantation dosage with the dope regions 1211. As described above, because the sizes of the implantation windows are different, even if the implantation conditions are the same, the doping concentration of the doped regions 1212 may be 10% lower than that of the doped regions 1112.

Figure 6C:
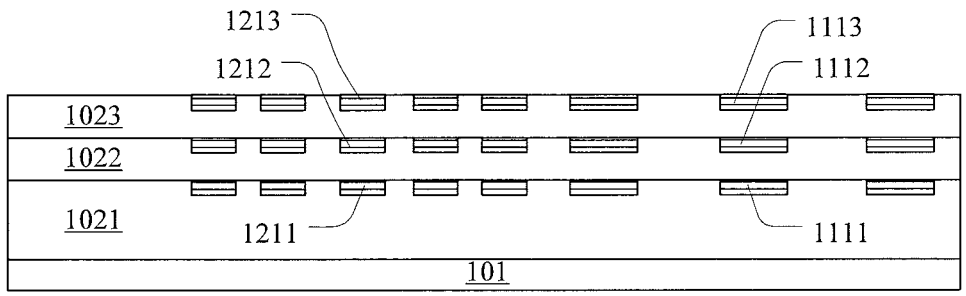

Then, the steps shown in FIGS. 6a and 6b are repeated for forming a third epitaxial layer 1023 on the second epitaxial layer 1022 and forming the doped regions 1113 and 1213 in the third epitaxial layer 1023, as shown in FIG. 6c.

In the several epitaxial growth and ion implantation steps described above, a stacked structure of a plurality of epitaxial layers is formed, the doped regions in the epitaxial layers are aligned. According to different requirements on the blocking voltage of the power device, typically the above-described steps may be repeated 4 to 10 times, for example, 4 times in the present embodiment. The thickness and resistivity of each grown epitaxial layer are same with those of the second epitaxial layer 1022.

In the vertical direction Y, the impurity implantation dosage of each of the doped regions 1111 to 1113 varies non-linearly, the impurity implantation dosage of a portion close to the drain electrode may be 20% lower than that of a portion close to the source electrode. The impurity implantation dosage of each of the doped regions 1211 to 1213 varies non-linearly, the impurity implantation dosage of a portion close to the drain electrode may be 20% less than that of a portion close to the source electrode. In each layer, the impurity implantation dosage of the doped regions in the loop region is 10% less than that of the doped regions in the cell region.

Figure 6D:
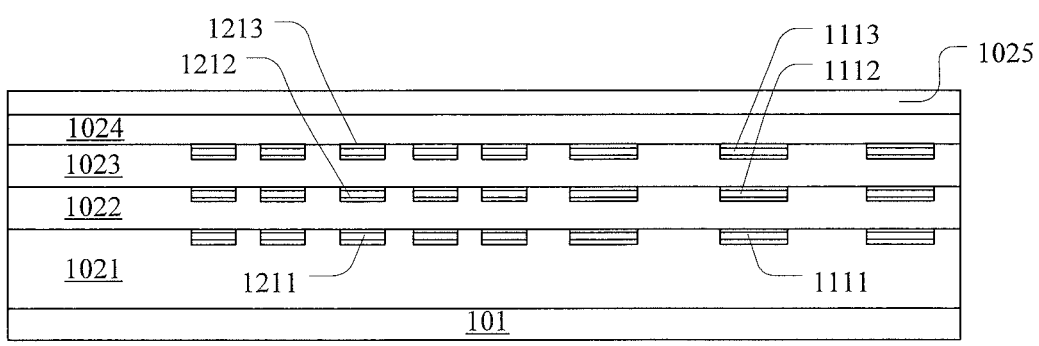

Then, a fourth epitaxial layer 1024 is grown on the third epitaxial layer 1023, as shown in FIG. 6d. The thickness and the resistivity of the fourth epitaxial layer 1024 may be slightly different from the previous epitaxial layers, according to the parameters and characteristics of the power device. For example, the fourth epitaxial layer 1024 has a thickness of 4~7 um and a resistivity of 1~4 ohms*cm. Thermal annealing is performed after the epitaxial growth process. After the process under high temperature of 1000~1150° C., a silicon oxide layer 1025 with a thickness of 3000~6000 A is formed.

Figure 6E:
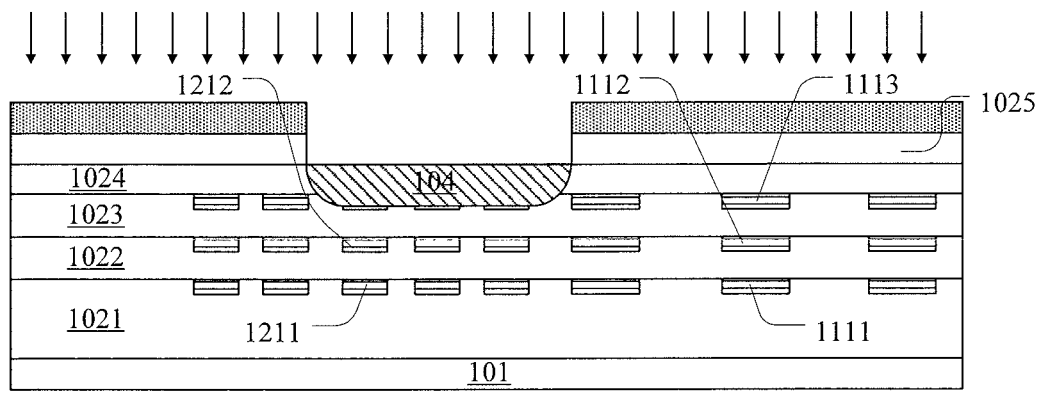

Then, the surface of silicon oxide layer 1025 is coated by photoresist, and a photoresist mask PR2 is formed by photolithography processes including exposure, development, etc. The photoresist mask PR2 comprises pattern of injection windows which are configured to expose the surface of the silicon oxide layer 1025 at corresponding positions of the seventh doped regions. The dopant implantation is performed through the photoresist mask PR2, such that a seventh doped region 104 is formed, as shown in FIG. 6e.

In this step, before the ion implantation, surface silicon dioxide can be removed by etching. Boron impurities are implanted then. The ion implantation has energy of 40~100 KeV and dosage of $3E12 \sim 3E13 \text{ cm}^{-2}$. After the ion implantation, the photoresist mask PR1 is removed by ashing or dissolved by solvent.

Subsequently, the high-temperature driving process is performed for a long time. This process comprises a heat treatment at a temperature of 1100~1200° C. for around 60 to 300 minutes.

Figure 6F:
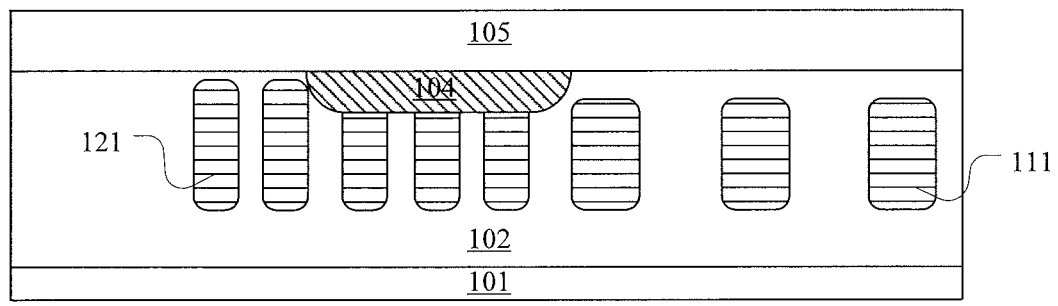

During the high temperature driving process, the impurities in the doped regions 1111 to 1113 and 1211 to 1213 in the epitaxial layers 1021 to 1023 will spread around. In the vertical direction Y, the doped regions 1111 to 1113 are connected to each other to form the second doped region 111, the doped regions 1211 to 1213 are connected to each other to form the third doped region 121. Further, during the high temperature driving process, a silicon oxide layer 105 is grown on the surface of the fourth epitaxial layer 1024 and has a thickness reaching 0.8~1.6 um, as shown in FIG. 6f.

Then, the surface of silicon oxide layer 105 is coated by photoresist, and a photoresist mask is formed by photolithography processes including exposure, development, etc. The photoresist mask comprises pattern with etching windows, and the portion of the first doped region 102 corresponding to the position of the entire cell region and the position of the portion of the loop region corresponding to the cut-off region is exposed by the etching windows. By wet etching, the silicon oxide layer 105 on the entire cell region, the loop region and the cut-off region are removed. After etching, the photoresist mask is removed by ashing or dissolved by solvent.

Preferably, a thermal growth process is performed for forming a thin oxide layer with a thickness of 200~600 A, the thin oxide layer serves as an ion implantation blocking layer. An overall implantation using N type impurities is performed for improving the N type doping concentration on the surface of the cell region 110. Usually phosphorus impurities are introduced in the implantation, the implantation dosage is generally selected between $7E11 \text{ cm}^{-2}$ to $7E12 \text{ cm}^{-2}$. After the implantation, a high-temperature process is performed then, typically, the temperature of the process is selected between 1100° C. to 1150° C., and the impurities are diffused to a depth of 1~3 um below the surface by the high-temperature process.

Further, after a surface cleaning process, the silicon oxide is thermally grown under a 900~1000° C. temperature condition, thereby a gate dielectric 115 is formed. The thickness of the gate dielectric 115 is generally 800~1200 A. A polysilicon deposition process is performed by LPCVD method, the thickness of the deposited polysilicon is 3000~5000 A. The polysilicon is doped with impurity, the impurity may be doped by diffusion or implantation method, and the square resistance of the doped polysilicon generally ranges from 5 to 30 ohm/cm.

Figure 6G:
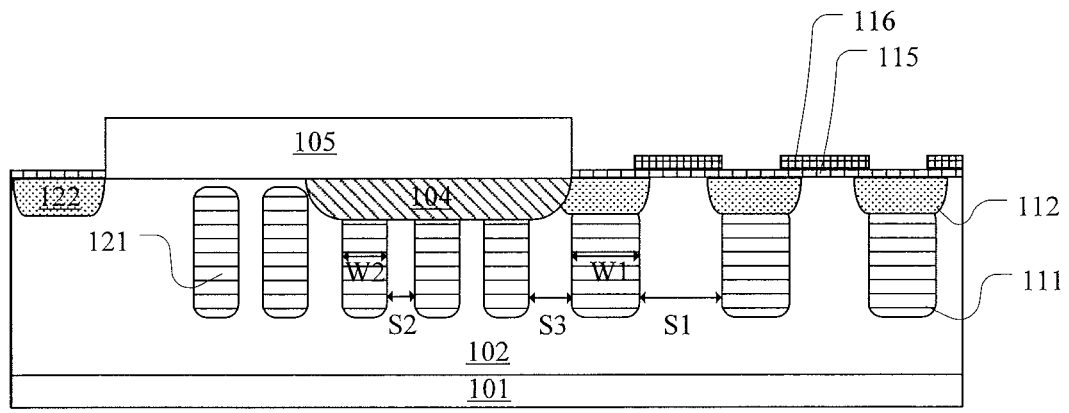

Further, photoresist coating process is performed, and a photoresist mask is formed by photolithography processes including exposure, development, etc. The photoresist mask comprises pattern with etching windows, and the portion of the polysilicon surface which corresponds to the cell region except the portion of the gate conductors are exposed by the etching windows. By wet etching, the exposed portion of the polysilicon is removed, thereby gate conductors 116 are formed, as shown in FIG. 6g. After etching, the photoresist mask is removed by ashing or dissolved by solvent.

Further, an ion implantation is performed through a photoresist mask, thereby forming the fourth doping regions 112 in the cell region 110, and the eighth doped regions 122 are formed in the loop region 120. The fourth doping regions 112 serve as the body well region of the power device.

According to the requirement on the threshold voltage of the power device, the implantation dosage of the body well can be determined. Usually the threshold voltage is 3V and the dosage is $2E13 \sim 5E13 \text{ cm}^{-2}$. After a high-temperature driving process at 1100° C.~1150° C., the junction depth of each fourth doped region 112 reaches 2~4 um, so that the fourth doped regions contact with the second doped regions 111.

Further, ion implantation is performed through a photoresist mask, thereby forming sixth doping regions 114 in the fourth doped regions 112. The sixth doping regions 114 serve as the leading-out ends of the body well regions. The ion implantation, for example, has a dosage of $1E15 \sim 5E15 \text{ cm}^{-2}$, and boron impurities are used as dopant.

After the sixth doping region 114 is formed, a thermal process with the temperature of 900~1000° C. and the process time of 30~90 minutes is performed to form a junction of 0.5~1.5 um depth. The sixth doping region 114 is connected to the fourth doping region 112, for contacting with the body well.

Further, an ion implantation is performed through a photoresist mask, thereby forming fifth doping regions 113 in the fourth doped regions 112. The fifth doping regions 113 serve as source regions of the power device. The ion implantation, for example, has a dosage of $1E15 \sim 5E15 \text{ cm}^{-2}$, and arsenic impurities are used as dopant. The sixth doped regions 114 extend into the fourth doped regions 112 and adjoin to the fifth doped regions 113.

Further, the interlayer dielectric layer 105 is formed on the surface of the device structure. The interlayer dielectric layer 105, for example, is an insulating layer or a silicon glass containing boric acid, formed by deposition. A through hole is formed by etching on the interlayer dielectric layer 105 by use of a photoresist mask. Further, a metal layer is filled into the through hole by deposition, the thickness of the metal layer is, for example, 3~4.5 um. The metal layer is patterned to form a first electrode 118 and a second electrode 128.

The first electrode 118 is configured to contact with the fifth doped regions 113 via the through hole, thus providing an electrical connection to the source regions. Meanwhile, the first electrode 118 is configured to provide short connections between the fifth doped regions 113 and the sixth doped regions 114. The second electrode 128 is configured to contact with the eighth doped region 122 via the through hole, thus providing an electrical connection to the cut-off ring.

A substrate thinning process is performed on the semiconductor substrate 101, so that the thickness of the semiconductor substrate 101 is reduced down to 200~300 um. Analogously, a third electrode 108 is formed on a surface of the semiconductor substrate which is opposite to the first doped region 102, thus providing an electrical connection to the drain regions. In this embodiment, the first electrode 118 and the third electrode 108 serve as a source electrode and a drain electrode of MOSFET, respectively.

Figure 6H:
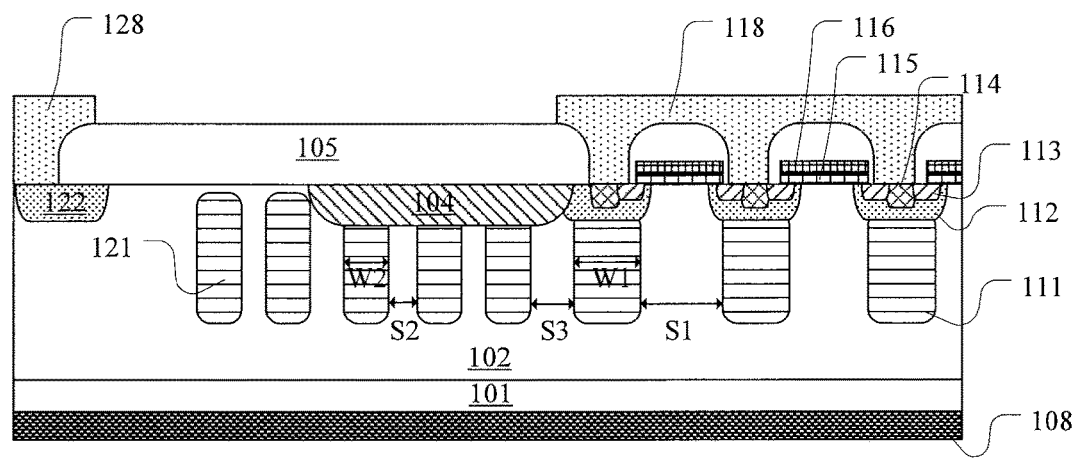

Finally, the structure of the power device 100 manufactured by the method is shown in FIG. 6h.

Third Embodiment

Figure 7:
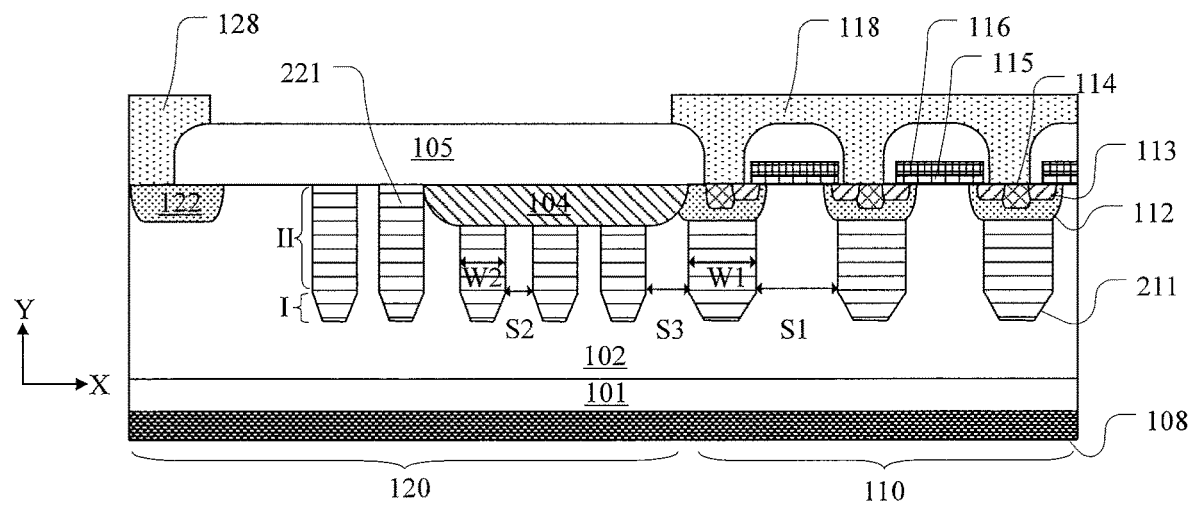
FIG. 7 shows a cross-sectional view of a power device according to a third embodiment of the present invention.

FIG. 7 shows a cross-sectional view of a power device according to a third embodiment of the present invention.

In this embodiment, the power device 200 is a metal oxide semiconductor field effect transistor (MOSFET). Hereinafter, an N type MOSFET is taken as an example, however, the present invention is not limited thereto.

Referring to FIG. 7, there is shown longitudinal structures of a cell region 110 and a loop region 120. For simplicity and clarity, the figures only show the longitudinal structures of the cell region 110 comprising two cells and the loop region 110 comprising 5 third doped regions 221, while in actual products, the cell region may comprise more than two cells and the loop region may have more or less than five third doped regions. In the power device 200, the cell region 110 and the loop region 120 comprise a common semiconductor substrate 101 and the first doped region 102 located on the semiconductor substrate 101. In this embodiment, the semiconductor substrate 101, for example, is a silicon substrate of N++ type doping, the first doped region 102, for example, is an in-situ doped epitaxial semiconductor layer of N type doping. The semiconductor substrate 101 is used as the drain region of the MOSFET.

In the cell region 110, a plurality of second doped regions 211 of P type doping are formed in the first doped region 102. The doping type of the first doped region 102 is opposite to the doping type of the plurality of second doped regions 211, the plurality of second doped regions 211 are alternately arranged in the first doped region 102, forming a first charge compensation structure. In the loop region 120, a plurality of third doped regions 221 of P type doping are formed in the first doped type 102. The doping type of the first doped region 102 is opposite to the doping type of the plurality of third doped regions 221, the plurality of third doped regions 221 are alternately arranged in the first doped region 102, forming a second charge compensation structure. The plurality of second doped regions 211 and the plurality of third doped regions 221 have a decreased doping concentration distribution from top to bottom, respectively, and each of the doped regions may comprise a plurality of stacked epitaxial layers.

Further, in the cell region 110, a plurality of fourth doped regions 112 are formed on the plurality of second doped regions 211, and a plurality of fifth doped regions 113 are formed in the fourth doped regions 112. The fourth doped regions 112 and the fifth doped regions 113, for example, are formed by ion implantation and doped with P type dopant and N+ type dopant, respectively. The fourth doped regions 112 serve as body well regions of MOSFET, the fifth doped regions 113 serve as the source regions of MOSFET. Bottom of each fourth doped region 112 contacts with a corresponding one of the second doped regions 211. Preferably, a plurality of sixth doped regions 114 may be formed in the fourth doped regions 112. The sixth doped regions 114, for example, are formed by ion implantation and doped with P+ type dopant. The sixth doped regions 114 extend into the fourth doped regions 112 and adjoin to the fifth doped regions 113. In the preferred embodiment, the sixth doped regions 114 serve as the leading-out ends of the body well regions.

On surfaces of the first doped regions 102 and the fourth doped regions 112, gate stacks comprising gate dielectrics 115 and gate conductors 116 are formed. Each gate conductor 116 extends laterally from the corresponding first doped region 102 to the corresponding fifth doped region 113. At least a portion of each gate conductor 116 is located above the fourth doped region 112, such that the channel region of MOSFET is formed by the portion of the fourth doped region 112 located between the first doped region 102 and the fifth doped region 113.

Further, in the loop region 120, a seventh doped region 104 is formed in the first doped region 102. The seventh doped region 104, for example, is formed by ion implantation and doped with P type dopant. The seventh doped region 104 extends laterally to the fourth doped region 112, thus a main junction is formed. The seventh doped region 104 extends longitudinally from the surface to a predetermined depth, contacts with a part of the third doped regions 221, such that a part of the fourth doped regions 112 can connect with the part of the third doped regions 221 through the main junction. Further, an eighth doped region 122 is formed in the first doped region 102. Boundary of MOSFET is limited by the eighth doped region 122, which serves as a cut-off ring. The eighth doped region 122, for example, is formed by ion implantation and doped with P+ type dopant. The eighth doped region 122 and the fourth doped regions 112, both of which are doped of a same type and extend to a same depth, may be formed at the same time.

Further, an interlayer dielectric layer 105 is configured to cover the above device structure. A through hole is formed in the interlayer dielectric layer 105. A first electrode 118 is configured to contact with the fifth doped regions 113 via the through hole, thus providing an electrical connection to the source regions. Meanwhile, the first electrode 118 is configured to provide short connections between the fifth doped regions 113 and the sixth doped regions 114. A second electrode 128 is configured to contact with the eighth doped region 122 via the through hole, thus providing an electrical connection to the cut-off ring. A third electrode 108 is formed on a surface of semiconductor substrate which is opposite to the first doped region 102, thus providing an electrical connection to the drain regions. In this embodiment, the first electrode 118 and the third electrode 108 serve as a source electrode and a drain electrode of MOSFET, respectively.

In this embodiment, the second doped regions 211 and the third doped regions 221 are formed simultaneously. Different from the first embodiment, the second doped regions 211 and the third doped regions 221 are formed by deep trench etching and epitaxial layer backfilling techniques, and have exactly the same resistivity. However, because the deep trenches have different shapes, shapes at bottom ends of the second doped regions 211 and the third doped regions 221 are different.

For clearly illustration, a horizontal direction X and a vertical direction Y are defined in FIG. 7. The horizontal direction X extends laterally from the loop region 120 to the cell region 110. The vertical direction Y extends longitudinally from the semiconductor substrate 101 to the fifth doping regions 113.

In the horizontal direction X, W1 represents a width of one second doped region 211, S1 represents a spacing between the adjacent second doped regions 211; W2 represents the width of one third doped region 221, S2 represents a spacing between the adjacent third doped regions 221, S3 represents a spacing between one third doped region 221 and one second doped region 211 adjacent to each other. In actual manufacturing process, a requirement on implantation window for deep trenches in X direction should be satisfied by the following rule: W1+S1=n*(W2+S2), and W1/(W1+S1)=W2/(W2+S2), where n is an integer.

In the vertical direction Y, the doping concentration of the second doped regions 211 and the third doped regions 221 are non-linearly changed. Tops of each second doped region 211 and each third doped region 221 are close to the source regions of the power device, i.e., the fifth doping regions 113, bottoms are close to the drain regions of the power device, i.e., the semiconductor substrate 101. The second doped regions 211 and the third doped regions 221 have a decreased doping concentration distribution from top to bottom respectively.

The region I is a portion of the first charge compensation structure near the drain electrode; the region II is a portion of the first charge compensation structure near the source electrode. The shape of the P type epitaxial layer filled in the region I is not the same with that in the region II of the second doped regions 111. In the region I, a Y-direction interfacial surface between the second doped region 211 and the first doped region 102 has a small slope relative to the axis in the X direction; in the region II, a Y-direction interfacial surface between the second doped region 211 and the first doped region 102 has a higher slope relative to the axis in the X direction. The slopes are different because the etching angles, respectively for etching the deep trenches in the region I and the region II, are different. Generally, the etching angle for the region I is 85° ~87°, and the etching angle for the region II is 88° ~89°.

Specifically, when a certain doping concentration of the backfilled epitaxial layer is determined, due to slope angle, the doping concentration of the first doped region 102 is higher than that of the second doping regions 111 in the region I; and the doping concentration of the first doped region 102 is approximately equal to that of the second doped regions 111 in the region II. In the vertical direction Y, the doping concentration of each second doped region 111 appears to vary non-linearly, and the average doping concentration of each second doped region is lower than that of the first doped region 102.

Fourth Embodiment

Figure 8:
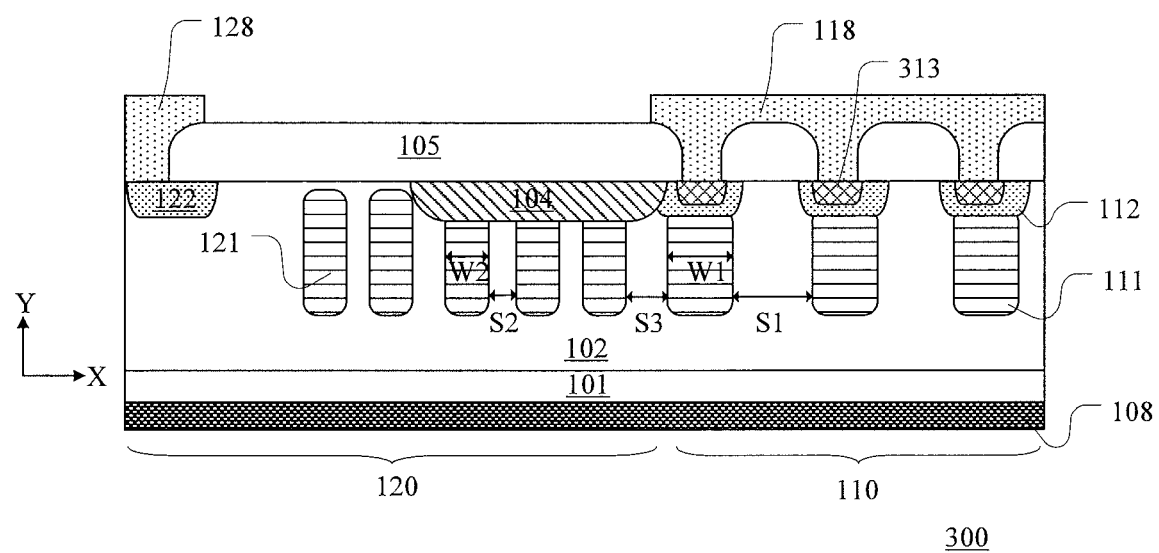
FIG. 8 shows a cross-sectional view of a power device according to a fourth embodiment of the present invention.

FIG. 8 shows a cross-sectional view of a power device according to a fourth embodiment of the present invention. In this embodiment, the power device 300 is a diode.

Referring to FIG. 8, longitudinal structures of a cell region 110 and a loop region 120 are shown. For simplicity and clarity, the figures only show the longitudinal structures of the cell region 110 comprising two cells and the loop region 110 comprising 5 third doped regions 121, while in actual products, the cell region may comprise more than two cells and the loop region may have more or less than five third doped regions. In the power device 300, the cell region 110 and the loop region 120 comprise a common semiconductor substrate 101 and the first doped region 102 located on the semiconductor substrate 101. In this embodiment, the semiconductor substrate 101, for example, is a silicon substrate of N++ type doping, the first doped region 102, for example, is an in-situ doped epitaxial semiconductor layer of N type doping. The semiconductor substrate 101 serves as the cathode of the diode.

In the cell region 110, a plurality of second doped regions 111 of P type doping are formed in the first doped region 102. The doping type of the first doped region 102 is opposite to the doping type of the plurality of second doped regions 111, the plurality of second doped regions 111 are alternately arranged in the first doped region 102, forming a first charge compensation structure. In the loop region 120, a plurality of third doped regions 121 of P type doping are formed in the first doped type 102. The doping type of the first doped region 102 is opposite to the doping type of the plurality of third doped regions 121, the plurality of third doped regions 121 are alternately arranged in the first doped region 102, forming a second charge compensation structure. The plurality of second doped regions 111 and the plurality of third doped regions 121 have a decreased doping concentration distribution from top to bottom, respectively, and each of the doped regions may comprise a plurality of stacked epitaxial layers.

Further, in the cell region 110, a plurality of fourth doped regions 112 are formed on the plurality of second doped regions 111, and a plurality of fifth doped regions 313 are formed in the fourth doped regions 112. The fourth doped regions 112 and the fifth doped regions 313, for example, are formed by ion implantation and doped with P type dopant and P+ type dopant, respectively. A fourth doping region 112 serves as the anode of the diode. Bottom of each fourth doped region 112 contacts with a corresponding one of the second doped regions 111. Preferably, a plurality of fifth doped regions 313 may be formed in the fourth doped regions 112. The fifth doped regions 313, for example, are formed by ion implantation and doped with P+ type dopant. The fifth doped regions 313 extend laterally to the fourth doped regions 112. In the preferred embodiment, the fifth doped regions 313 serve as the leading-out ends of the anode.

Further, in the loop region 120, a seventh doped region 104 is formed in the first doped region 102. The seventh doped region 104, for example, is formed by ion implantation and doped with P type dopant. The seventh doped region 104 extends laterally to the fourth doped region 112, thus a main junction is formed. The seventh doped region 104 extends longitudinally from the surface to a predetermined depth, contacts with a part of the third doped regions 121, such that a part of the fourth doped regions 112 can connect with the part of the third doped regions 121 through the main junction. Further, an eighth doped region 122 is formed in the first doped region 102. Boundary of the diode is limited by the eighth doped region 122, which serves as a cut-off ring. The eighth doped region 122, for example, is formed by ion implantation and doped with P+ type dopant. The eighth doped region 122 and the fourth doped regions 112, both of which are doped of a same type and extend to a same depth, may be formed at the same time.

Further, an interlayer dielectric layer 105 is configured to cover the above device structure. A through hole is formed in the interlayer dielectric layer 105. A first electrode 118 is configured to contact with the fifth doped regions 313 via the through hole, thus providing an electrical connection to the anode. Meanwhile, the first electrode 118 is configured to provide short connections between the fifth doped regions 313 and the sixth doped regions 114. A second electrode 128 is configured to contact with the eighth doped region 122 via the through hole, thus providing an electrical connection to the cut-off ring. A third electrode 108 is formed on a surface of semiconductor substrate 101 which is opposite to the first doped region 102, thus providing an electrical connection to the cathode. In this embodiment, the first electrode 118 and the third electrode 108 respectively serve as an anode electrode and a cathode electrode of the diode.

For clearly illustration, a horizontal direction X and a vertical direction Y are defined in FIG. 8. The horizontal direction X extends laterally from the loop region 120 to the cell region 110. The vertical direction Y extends longitudinally from the semiconductor substrate 101 to the fifth doping regions 313.

In the horizontal direction X, W1 represents a width of one second doped region 111, S1 represents a spacing between the adjacent second doped regions 111; W2 represents the width of one third doped region 121, S2 represents a spacing between the adjacent third doped regions 121, S3 represents a spacing between one third doped region 121 and one second doped region 111 adjacent to each other. In actual manufacturing process, a requirement on implantation window in X direction should be satisfied by the following rule: $W1+S1=n*(W2+S2)$, and $W1/(W1+S1)=W2/(W2+S2)$, where n is an integer.

In the vertical direction Y, the doping concentration of the second doped regions 111 and the third doped regions 121 are non-linearly changed. Tops of each second doped region 111 and each third doped region 121 are close to the anode of the diode, i.e., the fifth doping regions 313, bottoms are close to the cathode of the diode, i.e., the semiconductor substrate 101. The second doped regions 111 and the third doped regions 121 have a decreased doping concentration distribution from top to bottom respectively.

According to the embodiments of the present invention, the power device may be a high-voltage power device, a diode or an IGBT power device. The power device comprises a first doped region and a second doped region, and the two kinds of doped regions are arranged alternately. In some specific embodiments, the position of the first doped region and the second doped region may be converted to each other.

In accordance with the example embodiment of the present invention described above, the description of embodiments of the present invention are not intended to be exhaustive or limited to embodiments of the invention in the form disclosed. Obviously, according to the above description, there may be many modifications and variations. The embodiments in the present disclosure was chosen and described in order to explain the principles of the invention and as a practical application to enable one skilled in the art to well utilize the invention in various embodiments and with various modifications. The scope of the invention should be limited by the claims of the invention.

The invention claimed is:

1. A method for manufacturing a power device, comprising:
    forming a first doped region on the semiconductor substrate;
    forming a plurality of second doped regions in a first region of the first doped region; and
    forming a plurality of third doped regions in a second region of the first doped region,
    wherein the semiconductor substrate and the first doped region are first doping type, the plurality of second and third doped regions are second doping type, the second doping type is opposite to the first doping type,
    wherein the plurality of second doped regions are separated with each other at a first predetermined spacing, a first charge compensation structure is formed by the first doped region and the plurality of second doped regions, the first charge compensation structure and the semiconductor substrate are located on current channel,
    wherein the plurality of third doped regions are separated with each other at a second predetermined spacing, a second charge compensation structure is formed by the first doped region and the plurality of third doped regions, the second charge compensation structure is configured to disperse continuous surface electric field of the power device,
    wherein an average doping concentration of the plurality of second doped regions is greater than that of the plurality of third doped regions.

2. The method according to claim 1, wherein the first charge compensation structure is located in a cell region of the power device, the second charge compensation structure is located in a loop region of the power device, the cell region is surrounded by the loop region, a difference between the average doping concentration of the plurality of second doped regions and the average doping concentration of the plurality of third doped regions is set for reducing an on-resistance of the cell region and improving a breakdown voltage of the cell region.

3. The method according to claim 1,
    wherein step of forming the plurality of second doped regions in the first region of the first doped region comprises: performing a first ion implantation through a first mask,
    wherein step of forming the plurality of third doped regions in the second region of the first doped region comprises: performing a second ion implantation through a second mask.

4. The method according to claim 3, wherein openings of the first mask each have a first transverse dimension, openings of the second mask each have a second transverse dimension, and the first transverse dimension is greater than the second transverse dimension.

5. The method according to claim 3, wherein a first ion implantation dosage is used during the first ion implantation, a second ion implantation dosage is used during the second ion implantation, the first ion implantation dosage and the second ion implantation dosage range from $2E12$ cm$^{-2}$ to $2E13$ cm$^{-2}$.

6. The method according to claim 5, wherein the first ion implantation dosage and the second ion implantation dosage are the same.

7. The method according to claim 5, wherein the first ion implantation dosage is 20% or over 20% higher than the second ion implantation dosage.

8. The method according to claim 1, wherein step of forming the plurality of second doped regions in the first region of the first doped region comprises filling first deep trenches with a plurality of epitaxial layers, step of forming the plurality of third doped regions in the second region of the first doped region comprises filling second deep trenches with a plurality of second epitaxial layers.

9. The method according to claim 8, wherein the first and second deep trenches extend in the first doped region longitudinally towards the semiconductor substrate, with a decrease of transverse dimension.

10. The method according to claim 9, wherein the deep trenches are formed by etching, and each have a shape with a reduction of transverse dimension by etching with different angles.

11. The method according to claim 10, wherein a lower portion of each deep trench is obtained by etching with an angle ranging from 85° to 87°, an upper portion of each deep trench is obtained by etching with an angle ranging from 88° to 89°.

* * * * *